United States Patent [19]

Henderson

[11] Patent Number: 4,607,322

[45] Date of Patent: Aug. 19, 1986

[54] ENERGY RECOVERY SNUBBER

[75] Inventor: Eric A. Henderson, Rockford, Ill.

[73] Assignee: Sundstrand Corporation, Rockford, Ill.

[21] Appl. No.: 651,623

[22] Filed: Sep. 17, 1984

[51] Int. Cl.⁴ .................. H02H 7/122; H02M 3/337
[52] U.S. Cl. ...................................... 363/56; 361/91; 363/24; 363/134
[58] Field of Search .................... 363/24–26, 363/56, 134; 361/91, 100, 111

[56] References Cited

U.S. PATENT DOCUMENTS

| | | | |
|---|---|---|---|
| 3,437,908 | 4/1969 | Vincent | 363/133 |
| 4,063,306 | 12/1977 | Perkins et al. | 363/17 |
| 4,336,587 | 6/1982 | Boettcher et al. | 363/56 |
| 4,378,586 | 3/1983 | Bete | 363/56 |
| 4,438,486 | 3/1984 | Ferraro | 363/56 |

FOREIGN PATENT DOCUMENTS

| | | | |
|---|---|---|---|
| 1956145 | 5/1971 | Fed. Rep. of Germany | 363/56 |
| 69463 | 4/1983 | Japan | 363/56 |
| 873361 | 10/1981 | U.S.S.R. | 363/134 |
| 877757 | 11/1981 | U.S.S.R. | 363/134 |

Primary Examiner—William H. Beha, Jr.
Attorney, Agent, or Firm—Wood, Dalton, Phillips Mason & Rowe

[57] ABSTRACT

A snubber circuit for protecting power switches which modulate the flow of power through an inductive element in a power converter, such as a main primary winding of a transformer, includes a snubbing capacitor and a first switch which is operable to connect the snubbing capacitor to a power switch. A second switch is operable to connect the snubbing capacitor to an auxiliary primary winding of the transformer. The first and second switches are operated so that immediately prior to turn-off of the power switch, the capacitor is connected thereto to store the turn-off reactive power caused by turn-off of the power switch. The first switch is then opened and the second switch closed to couple the reactive power to the auxiliary primary winding to improve the efficiency of the converter.

16 Claims, 5 Drawing Figures

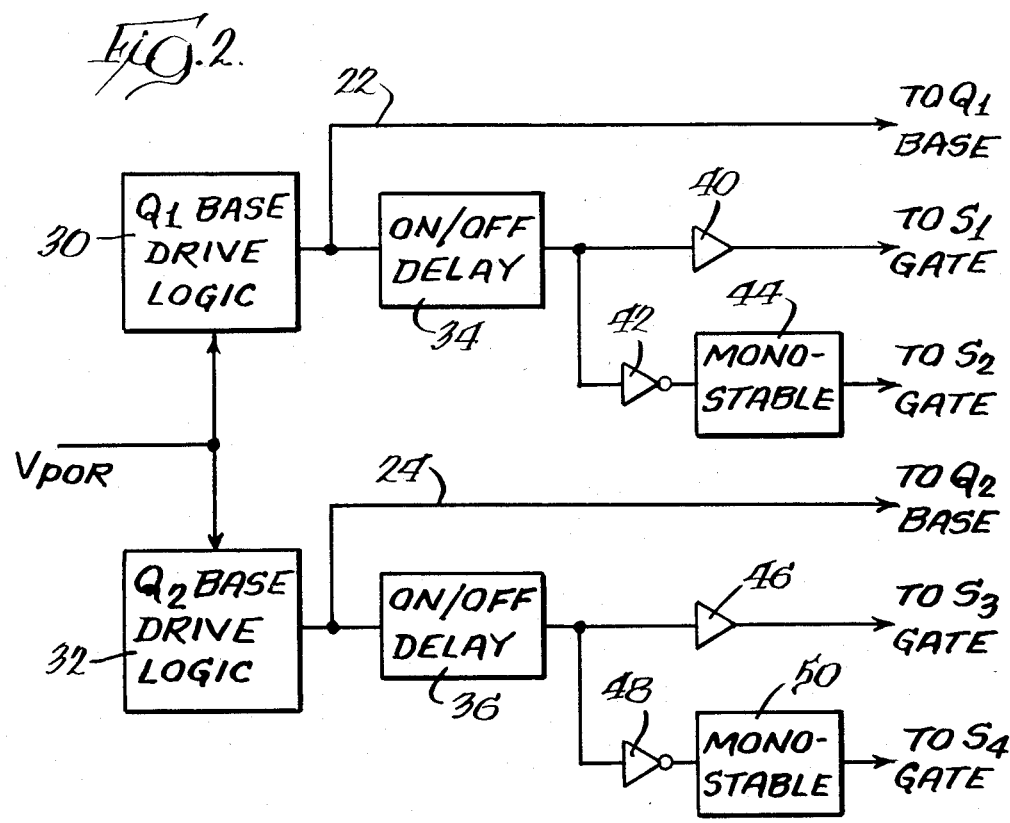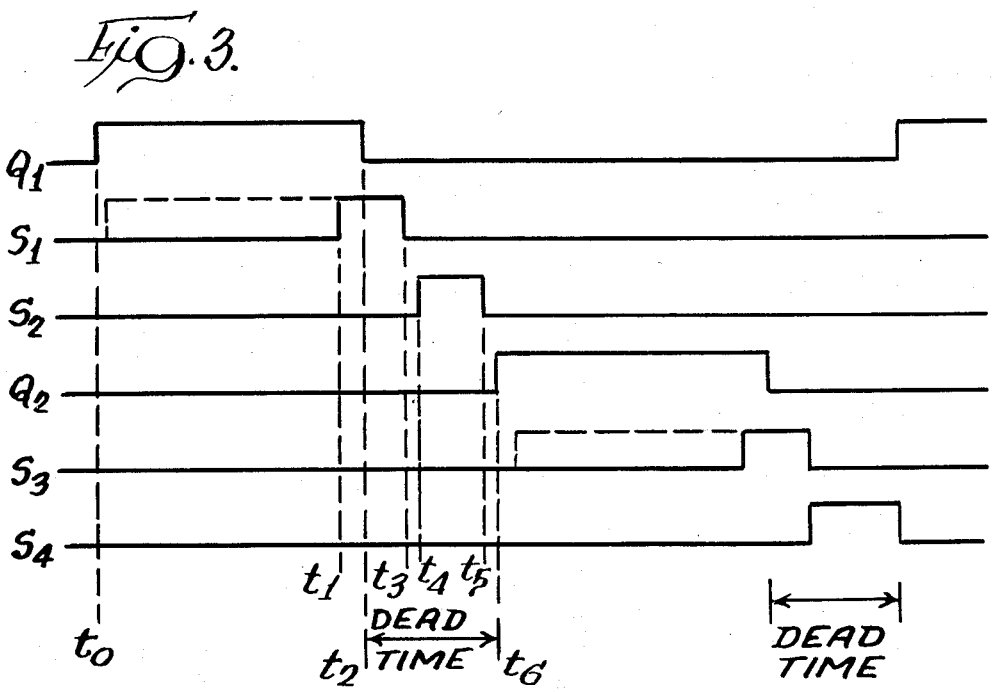

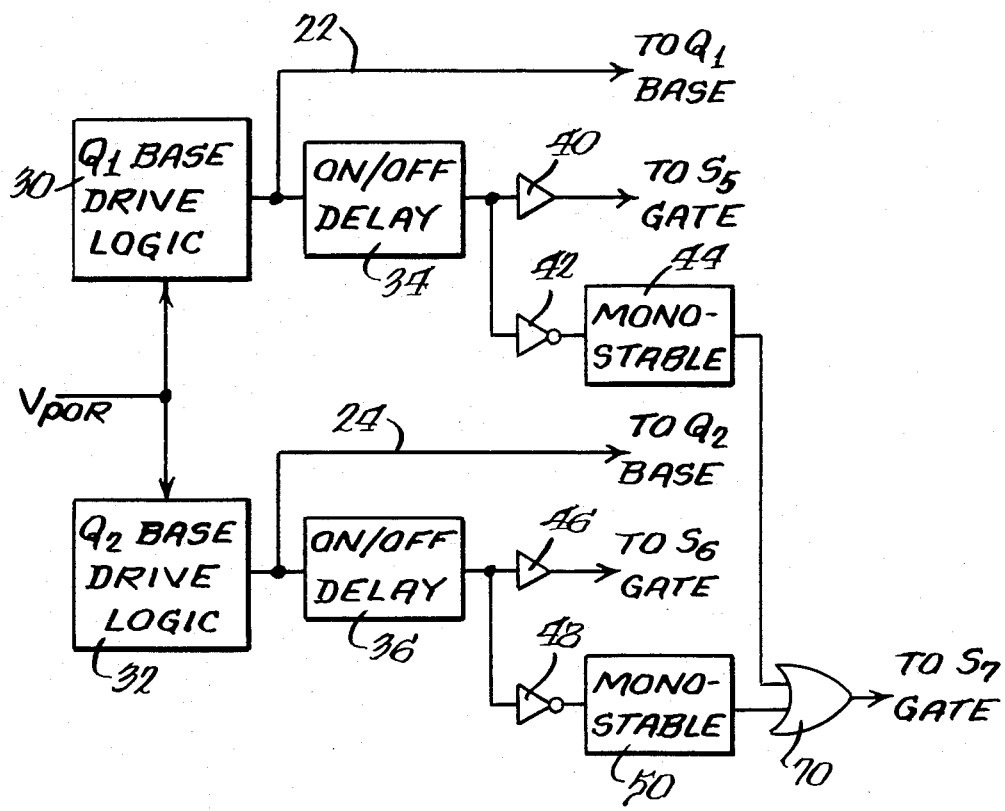

ENERGY RECOVERY SNUBBER

DESCRIPTION

1. Technical Field

The present invention relates generally to switch protection circuitry, and more particularly to a snubber circuit for protecting switching transistors from turn-off voltage transients.

2. Background Art

One prior type of snubber circuit utilizes a snubber capacitor connected in series with a parallel combination of a diode and resistor with the combination being connected across a switching transistor. The transistor is in turn switched between on and off states to control the flow of current through an inductive load, such as a transformer. When the transistor is switched to the off state, the current through the transformer does not instantaneously fall to zero but continues for a short time, during which time the voltage across the transistor increases to a high value. To prevent the transistor from being subjected to high power levels, the diode is poled to pass the transient turn-off current from the inductive load to the capacitor. The current is therefore shunted away from the switching transistor to prevent damage thereto.

The transient energy stored in the capacitor is dissipated when the switching transistor subsequently turns back on, in which case the resulting current flows from the capacitor through the resistor and transistor. Hence, these components dissipate the transient energy with no contribution to output power. The snubber circuit therefore causes a power loss in the converter which can be on the order of 850 watts per switch or more.

A different type of snubber circuit for a DC-AC converter is disclosed in Perkins et al U.S. Pat. No. 4,063,306. This patent discloses a circuit wherein switching transient energy following turn-off of a transistor is stored in a capacitor and is transferred to a transformer, and thus to a load, during a period just following turn-off of the transistor.

The Perkins et al circuit is only effective to provide protection for turn-off transients caused by inductive reactance of a transformer and does not provide protection from or recovery of reactive energy developed by other circuit elements having inductive reactance, such as the power supply leads supplying DC input power to the converter.

Furthermore, the Perkins et al snubber circuit stores the reactive energy in a capacitor for a relatively long time period, during which time leakage may occur, in turn reducing the efficiency of the overall circuit.

Also, the reactive power stored in the capacitor of Perkins et al can only be coupled back to the transformer and cannot be transferred to other parts of the circuit. This limits the usefulness of this type of circuit.

DISCLOSURE OF THE INVENTION

In accordance with the present invention, a snubber circuit for protecting a switching transistor in a power converter includes means for coupling transient energy to a load during the time that the switching transistor is in an off state.

In a first embodiment of the invention, the snubber circuit includes a capacitor which is coupled by means of a first snubber switch across a switching transistor of a power converter. The switching transistor in turn modulates the flow of current through a primary winding of a transformer. An auxiliary primary winding of the transformer is inductively linked with the main primary winding and is coupled by means of a second snubber switch to the junction between the first snubber switch and the capacitor. Shortly before turn-off of the switching transistor, the first snubber switch is closed and the second snubber switch opened so that the snubber capacitor is connected in parallel with the switching transistor. When the power transistor subsequently turns off, the transient energy developed by the primary winding of the transformer is stored by the snubber capacitor. The first snubber switch is then opened and the second snubber switch closed to couple the transient energy to the auxiliary primary winding.

The auxiliary primary winding may be wound in the same sense as the main primary winding so that the transient energy assists in driving a load coupled to a secondary winding of the transformer.

Alternatively, in an inverter having multiple switching transistors wherein the current through the main primary winding is periodically reversed, the auxiliary winding may be wound in a sense opposite that of a main primary winding so that the reactive energy assists in causing a flux reversal in the transformer primary.

In a further embodiment of the invention, the reactive energy is alternatively utilized to drive other switches in the power converter.

In each of the above embodiments, the transient energy is utilized rather than wasted, thereby improving the efficiency of the converter. In the first embodiment of the invention in which the reactive power is coupled to the transformer primary, duty cycles of switching transistors in the converter can be reduced.

Furthermore, reactive energy not only from the transformer but also from other sources of inductive reactance in the converter is stored and released to a desired point in the circuit so that the switching transistors are protected from all sources of reactive energy and not just the transformer. Also, since the reactive energy is released very shortly after turn-off of the transistor, the capacitor need not store the energy for as long a period as prior systems, thereby reducing the occurrence of leakage through the capacitor and thereby raising the efficiency of the converter.

BRIEF DESCRIPTION OF THE DRAWINGS

FIG. 2 is a block diagram of the switch control shown in FIG. 1;

FIG. 3 is a series of timing diagrams illustrating the operation of the circuitry shown in FIGS. 1 and 2;

FIG. 5 is a block diagram of the switch control shown in FIG. 4.

BEST MODE FOR CARRYING OUT THE INVENTION

Figure 1:
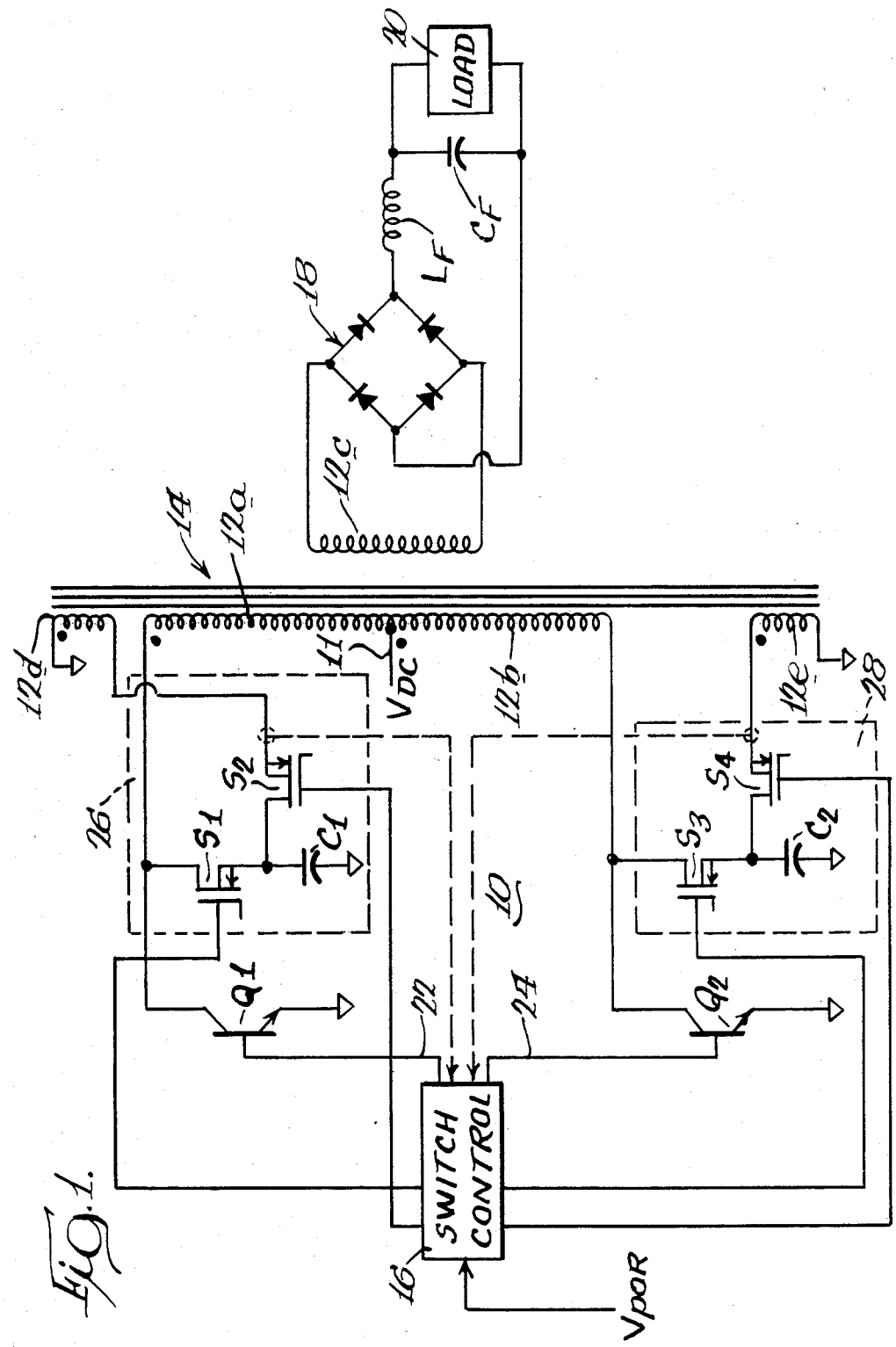
FIG. 1 is a simplified schematic diagram of a power converter incorporating the snubber circuit of the present invention.

Referring now to FIG. 1, there is illustrated a DC-to-DC converter 10 which includes an inverter developing alternating current power from DC power on a power supply lead 11 developed by a source of DC potential $V_{DC}$. The inverter illustrated in FIG. 1 includes first and second power switches in the form of switching transistors Q1,Q2 which are connected to main primary windings 12a, 12b of a transformer 14. The source of DC potential $V_{DC}$ is connected to a midtap of the transformer 14 and the transistors Q1,Q2 are periodically operated between on and off states by a switch control 16 so that alternating current power is developed in a secondary winding 12c of the transformer 14. The output of the secondary winding 12c is converted to DC power by a rectifier 18 and a filter comprising an inductor $L_F$ and capacitor $C_F$. The rectified and filter power is coupled to a load 20 to energize same.

The switch control 16 senses a voltage $V_{POR}$ at a point of regulation, or POR, near the load 20. The switch control 16 develops power transistor switching signals over a pair of lines 22,24 which are in turn coupled to the bases of the transistors Q1,Q2, respectively. As noted more specifically below, the transistors Q1,Q2 are operated one at a time so that a certain amount of "dead time" is interposed between periods during which one of the transistors Q1,Q2 is on.

Connected across the transistors Q1,Q2 are switched snubbing circuits 26,28 which are in turn connected to auxiliary primary windings 12d,12e, respectively of the transformer 14 which are inductively linked to the main primary winding 12b. The snubber circuit 26 includes a snubber capacitor C1 connected through a switch S1 to the junction between the main primary winding 12a and the collector of the transistor Q1. A second switch S2 is connected between the auxiliary primary winding 12d and the junction between the first switch S1 and the capacitor C1.

Likewise, the series combination of a switch S3 and a capacitor C2 are connected across the transistor Q2 and a switch S4 is connected between the auxiliary primary winding 12e and the junction between the switch S3 and the capacitor C2.

In the preferred embodiment, the switches S1–S4 are field effect transistors, although these switches may be other types of transistors or other controllable switching devices, as desired.

Referring now to FIG. 2, the switch control 16 includes first and second base drive logic circuits 30, 32 for the transistors Q1,Q2, respectively. The circuits 30,32 are coupled by means of the lines 22,24 to the bases of the transistors Q1,Q2, as previously noted.

The base drive logic circuits 30,32 are known circuits for controlling inverter switches and hence are not described in further detail other than to state that they energize the transistors Q1,Q2 one at a time with a period of dead time between operation of the switches.

The base drive logic circuits 30,32 are respectively connected to on/off delay circuits 34,36. The delay circuits 34,36 provide adjustable delays following a change in state of the signals from the base drive logic circuits 30,32. The on delay period may be different from the off delay period, as noted more specifically below.

The on/off delay circuit 34 is connected through an amplifier 40 to the gate of the transistor S1. The output of the delay circuit 34 is also connected through an inverter 42 to a monostable or one-shot multivibrator 44. The output of the monostable 44 is connected to the gate of the transistor S2. Likewise, the output of the on/off delay circuit 36 is connected through an amplifier 46 to the gate of the transistor S3 and through an inverter 48 and a monostable 50 to the gate of the transistor S4.

Referring also to FIG. 3, assume that at time $t = t_0$ the transistor Q1 is turned on by a base drive signal over the line 22 from the base drive logic circuit 30. At a time $t_1$ subsequent to $t_0$ but before the transistor Q1 is turned off (such as several hundred nanoseconds before turn-off), the switch S1 is turned on by a high state signal from the on/off delay circuit 34 so that the capacitor C1, FIG. 1, is connected across the transistor Q1. The variable time in which the switch S1 is closed subsequent to $t_0$ is illustrated by the dashed line in the timing diagram for S1 and is determined by the on delay period established by the circuit 34.

At time $t_2$, the transistor Q1 is turned off by the base drive logic circuit 30. At this point, the "dead time" begins during which neither transistor Q1 or Q2 is on. The transient energy (also referred to as "reactive power") developed by the main primary winding 12a of the transformer 14 and the power supply leads, such as lead 11, is coupled through the closed switch S1 to the capacitor C1 which charges to a voltage close to the voltage developed by the winding 12a.

At time $t_3$, the switch S1 is de-energized or opened by a low state signal from the on/off delay circuit 34. The length of time between $t_2$ and $t_3$, i.e. the necessary length of time between turn-off of Q1 and turnoff of the switch S1, is dependent upon the combined inductance of the circuit elements connected thereto, primarily the inductances of the transformer and power supply leads, such as lead 11, from the DC source. The length of time between times $t_2$ and $t_3$ is determined by the off delay period established by the circuit 34 and, in the preferred embodiment, is on the order of 1–4 microseconds. The capacitor C1 at this time is isolated from the winding 12a and the transistor Q1.

At time $t_4$ subsequent to time $t_3$, the switch S2 is energized or closed by a high state signal developed by the monostable 44 to connect the auxiliary primary winding 12d across the capacitor C1. The capacitor C1 discharges through the auxiliary primary winding 12d immediately following time $t_4$.

The monostable period is selected to insure that all of the reactive power is transferred to the auxiliary primary windings 12d. In the preferred embodiment, the monostable period is on the order of 1–2 microseconds.

The sense of the winding 12d relative to that of the windings 12a, 12b determines the effect that the coupling of the reactive power will have on the circuit operation. If the winding 12d is wound in the same sense as the winding 12a, as shown in FIG. 1, the reactive power increases the voltage $V_{POR}$ delivered to the load 20. This increase is sensed by the base drive logic circuits 30,32 which in turn reduce the duty cycles of the transistors Q1,Q2 to compensate therefor.

Alternatively, if the sense of the winding 12d is opposite to that of the winding 12a, the reactive power creates a flux in the core of the transformer 14 which opposes the flux established by the winding 12a. The reactive power therefore hastens flux reversal in the core of transformer 14 in preparation for the energization of the transistor Q2.

Alternatively, as shown by the dotted lines of FIG. 1, instead of coupling the reactive power to the transformer 14, the power may be utilized to operate other switches in the inverter, such as the transistor Q2. In this case, the switch S2 would not be coupled to the winding 12d but instead would be coupled through a small winding to the base drive circuit 32. This approach is primarily useful in power converters which do not employ a transformer such as an inverter.

Referring again to FIG. 3, at time t₅, the switch S2 is opened or turned off by the monostable 44. At a time t₆ subsequent to time t₅, the transistor Q2 is turned on or closed by a high state signal on the line 24. Following the time t₆, the switches S3,S4 are operated in a fashion identical to that described in connection with switches S1,S2 to couple the reactive power from the main primary winding 12b to the auxiliary primary winding 12e. As previously noted, the winding 12e may be wound in the same sense as the winding 12b, i.e. in an aiding fashion, or may be wound in a sense opposite to that of the winding 12b, i.e. in an opposing sense. Alternatively, the switch S4 may be coupled to the base drive circuit 30 through a small winding to provide power for energizing the transistor Q1.

The switches S1–S4 should operate somewhat quickly and have a low value of resistance when on to minimize power dissipation.

It should be noted that the reactive power need not be coupled to the transformer 14, or alternatively to the transistor base drive circuits, during the time that both transistors are off. For example, in a push-pull converter circuit having little or no "dead time", the reactive power can be coupled to the transformer immediately following charging of the snubbing capacitor, at which time another transistor in the converter is operating.

Figure 4:
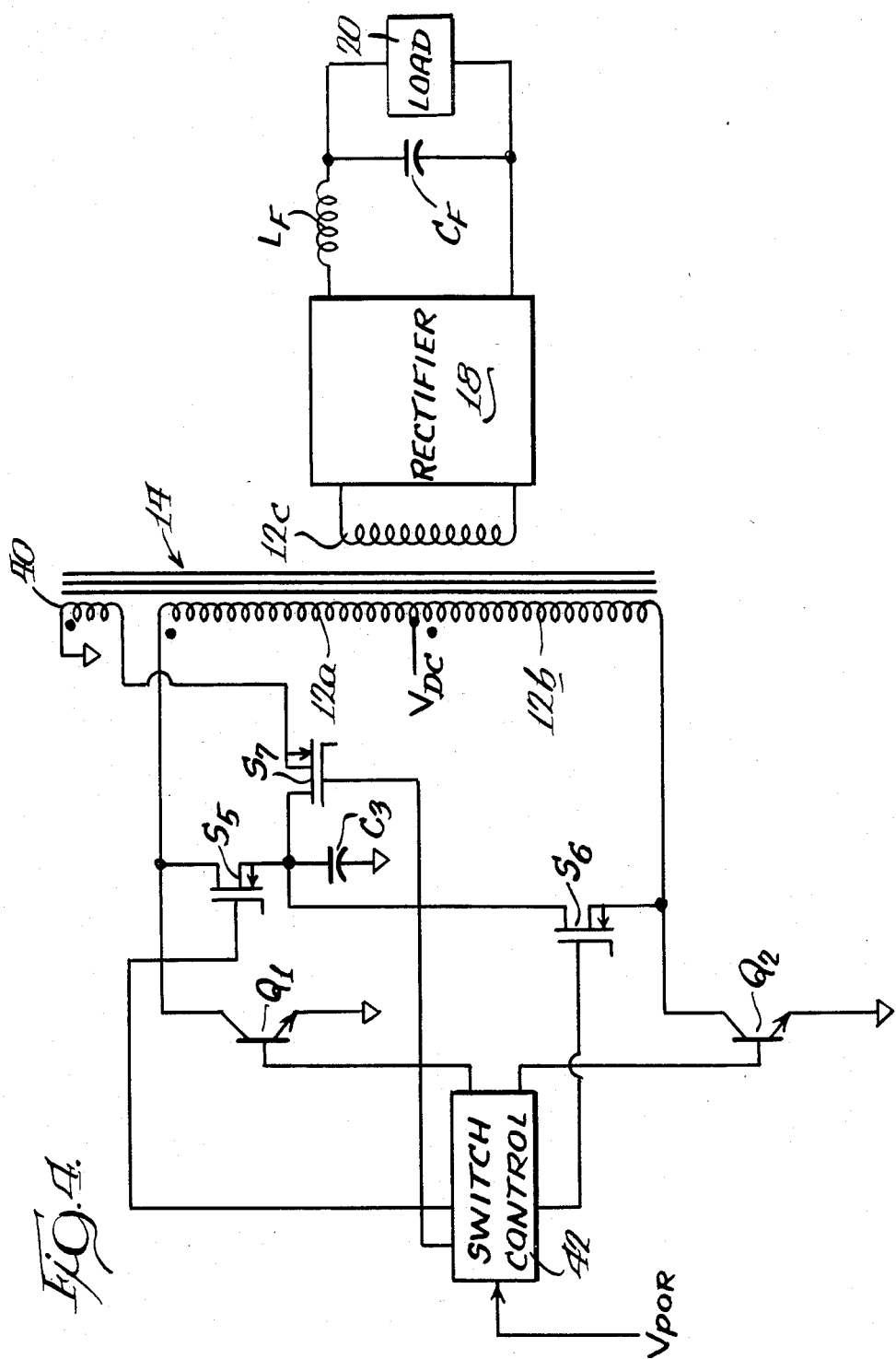
FIG. 4 is schematic diagram of a further embodiment of the invention.

Referring now to FIGS. 4 and 5, there is shown an alternative embodiment of the invention which utilizes fewer parts than the embodiment shown in FIG. 1. Elements common to FIGS. 1 and 2 and FIGS. 4 and 5 are assigned the same reference numeral.

In the embodiment of FIGS. 4 and 5, the transistors Q1,Q2 are connected to a snubbing capacitor C3 through switches S5,S6, respectively. The capacitor C3 is in turn coupled to an auxiliary winding 40 of the transformer 14 similar to the auxiliary winding 12d or 12e described in connection with FIG. 1.

The switches Q1,Q2 and S5–S7 are operated by a switch control 42 based upon the voltage $V_{POR}$ sensed at a point near the load 20. The switch S5 is turned on and the switches S6,S7 are maintained in an off state at a time prior to turn-off of the transistor Q1. When the transistor Q1 turns off, the resulting transient is snubbed by the capacitor C3. The switch S5 is then opened or de-energized and the switch S7 closed or energized by a high state signal from the monostable 44 through an OR gate 70 to couple the reactive power to the winding 40 similar to the operation of the switches S1 and S2 in the embodiment shown in FIG. 1.

Prior to the subsequent energization of the transistor Q2, the switch S7 is opened to decouple the capacitor C3 from the winding 40.

Following energization of the transistor Q2, the switch S6 is closed to connect the capacitor C3 across the transistor Q2. The reactive power developed by the winding 12b immediately following de-energization of the transistor Q2 is coupled to the capacitor C3 through the switch S6. The switch S6 is then opened and the switch S7 closed by a high state signal developed by the monostable 50 which is coupled through the OR gate 70 to deliver the reactive power to the winding 40.

It should be noted that the embodiment of Figs. 4 and 5 operates in a somewhat different manner than the embodiment of FIG. 1. In the embodiment of FIG. 4, the flux produced in the auxiliary winding 40 either aids or opposes the flux developed by the windings 12a, 12b since the flux in the core changes direction owing to the alternating energization of the transistors Q1,Q2. In other words, the direction of flux induced by the reactive power flowing through the auxiliary winding 40 is always in the same direction while the flux produced by the switching of the transistors Q1,Q2 changes direction. Consequently, the reactive power is coupled in an aiding sense (i.e. it raises the total output of the converter) when the reactive power results from the de-energization of the transistor Q1, and acts in an opposing sense (i.e. assists in flux reversal) when the reactive power is generated as a result of opening of the transistor Q2.

As was noted with respect to the embodiment shown in FIG. 1, the reactive power can instead be coupled back to the switch control circuit 42 to provide base drive power for the switching transistors in the converter.

In either of the above-described embodiments, the switching transistors Q1,Q2 are protected against potentially destructive high power levels caused by reactive power developed by circuit elements having an inductive reactance. These circuit elements may be the transformer 14 or could be any one or a number of inductive components, such as the power supply leads from the DC source.

Furthermore, either of the embodiments noted above may be utilized in other types of converters where switching transients can cause damage or destruction to switching elements.

I claim:

1. A snubber circuit for a power converter having at least one power switch which is turned on and off to modulate the flow of power through an inductive element, comprising:
    a capacitor;
    a first switch operable to connect the capacitor to the power switch;
    a load;
    a second switch operable to couple the capacitor to the load; and
    a switch control coupled to the first and second switches including means for operating the first switch while the power switch is on to transfer transient energy from the inductive element to the capacitor and means for operating the second switch after the power switch is turned off to transfer the transient energy to the load.

2. The snubber circuit of claim 1, wherein the inductive element comprises a main primary winding of a transformer and wherein the load is coupled to the capacitor through an auxiliary primary winding of the transformer.

3. The snubber circuit of claim 2, wherein the main and auxiliary windings are wound in the same sense on a core so that flux developed by the transient energy in the auxiliary winding aids the flux developed by the main winding.

4. The snubber circuit of claim 2, wherein the main and auxiliary windings are wound in different senses on the core so that flux developed by the transient energy in the auxiliary winding opposes the flux developed by the main winding.

5. A snubber circuit for a power converter having at least one power switch which is switched between on and off states by drive logic to modulate the flow of power from a power source to a load, the switch being connected to a transformer having a primary winding, comprising:
    a snubber capacitor;

a first switch operable to connect the snubber capacitor to the power switch and to the primary winding;

an auxiliary primary winding on the transformer;

a second switch operable to connect the snubber capacitor to the auxiliary primary winding; and a switch control including means for closing the first switch before the power switch is switched to the off state, means for opening the first switch a first predetermined time after the power switch is switched to the off state and means for closing the second switch after the first switch is opened to transfer to the auxiliary primary winding the transient energy following turn-off of the power switch.

6. The snubber circuit of claim 5 wherein the first switch closing means includes a delay circuit coupled to the drive logic for closing the first switch a first time period following turn-on of the power switch.

7. The snubber circuit of claim 5 wherein the second switch closing means includes a delay circuit coupled to the drive logic, an inverter coupled to the delay circuit and a monostable coupled between the inverter and the second switch whereby the delay circuit develops a low state signal after a second time period following turn-off of the power switch, the low state signal being converted to a high state signal by the inverter to trigger the monostable and close the second switch.

8. A snubber circuit for a power switch which is periodically operated between on and off states by a switch control to modulate the flow of power through a main primary winding of a transformer, the snubber circuit comprising:

a capacitor;

a first switch operable to connect the capacitor across the power switch;

an auxiliary primary winding inductively linked to the main primary winding;

a second switch operable to connect the capacitor to the auxiliary primary winding; and the switch control including means for operating the first switch before turn-off of the power switch and means for operating the second switch following turnoff of the power switch to transfer the transient energy to the auxiliary primary winding.

9. The snubber circuit of claim 8, wherein the main and auxiliary primary windings are wound in the same sense so that the flux produced by the auxiliary winding aids the flux produced by the main primary winding.

10. The snubber circuit of claim 8, wherein the main and auxiliary windings are wound in different senses so that the flux produced by the auxiliary winding opposes the flux produced by the main primary winding.

11. The snubber circuit of claim 8, wherein a second power switch is coupled to the main primary winding of the transformer, the power switches being periodically operated so that a period of dead time is interposed between switch operations during which neither switch is on, the snubber circuit further including an additional switch operable to connect the second power switch to the capacitor, the switch control further including means for operating the additional switch when the second power switch is on and means for operating the second switch during the dead time to transfer to the auxiliary winding the transient energy resulting from turn-off of the second power switch.

12. A snubber circuit for a power converter having two power switches which are periodically operated in alternate fashion between on and off states to modulate the flow of power through a main primary winding coupled to a load, the snubber circuit comprising:

a capacitor;

a first switch operable to connect the capacitor across one of the power switches;

a second switch coupled to the capacitor;

a third switch operable to connect the capacitor across the other of the power switches; and a switch control coupled to the first, second and third switches including means for operating the first switch when the one power switch is on, means for operating the second switch after the one power switch is turned off to transfer the transient energy resulting from turn-off of the one power switch to the load, means for subsequently operating the third switch when the other power switch is on and means for operating the second switch after the other power switch is turned off to transfer the transient energy resulting from turn-off of the other power switch to the load.

13. In a DC-to-AC power converter having two power switches which are periodically operated alternately between on and off states by a switch control to modulate the flow of power through a main primary winding of a transformer, the power switches being operated so that a period of dead time is interposed between switch operations during which neither switch is on, a snubber circuit for one of the power switches comprising:

a capacitor;

a first switch operable to connect the capacitor across the one power switch;

an auxiliary primary winding inductively linked to the main primary winding;

a second switch operable to connect the capacitor to the auxiliary primary winding; and a switch control including means for operating the first switch before turn-off of said one power switch to transfer energy upon turn-off of the one power switch from the transformer to said capacitor, and means for operating the second switch during the dead time following turn-off of the one power switch to transfer the energy from the capacitor to the auxiliary primary winding.

14. The snubber circuit of claim 13, further including a capacitor, a first switch and a second switch for the other of said power switches.

15. The snubber circuit of claim 13, further including an additional first switch operable to connect the capacitor across the other power switch and means in the switch control for operating the additional first switch before turn off of the other power switch to transfer energy upon turn off of the other power switch from the transformer to the capacitor and means for operating the second switch during the dead time following turn off of the other power switch to transfer the energy from the capacitor to the auxiliary primary winding.

16. A snubber circuit for a power converter having two power switches which are periodically operated in alternate fashion between on and off states to modulate the flow of power through a main primary winding of an inductive load, the snubber circuit comprising:

a capacitor;

a first switch operable to connect the capacitor across one of the power switches;

a second switch coupled to the capacitor; and a switch control coupled to the switches including means coupled to the second switch for developing switch control signals to the power switches, means for operating the first switch when the one power switch is on and means for operating the second switch after the one power switch is turned off to connect the capacitor to the developing means and transfer the transient energy resulting from turn-off of the one power switch to the other power switch to thereby operate same.

* * * * *